US006636116B2

(12) United States Patent
Cameron

(10) Patent No.: US 6,636,116 B2
(45) Date of Patent: Oct. 21, 2003

(54) FULLY DIFFERENTIAL CURRENT FEEDBACK AMPLIFIER

(75) Inventor: Jay K. Cameron, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 116 days.

(21) Appl. No.: 09/972,374

(22) Filed: Oct. 5, 2001

(65) Prior Publication Data

US 2003/0067352 A1 Apr. 10, 2003

(51) Int. Cl.[7] .................................................. H03F 3/45
(52) U.S. Cl. .................... 330/260; 330/124 R; 330/275; 330/278
(58) Field of Search ...................... 330/69, 260, 124 R, 330/295, 107, 253, 252, 257, 258, 278, 254, 275

(56) References Cited

U.S. PATENT DOCUMENTS

| | | | | |
|---|---|---|---|---|
| 4,536,716 A | * | 8/1985 | Yoshida et al. ............... | 330/69 |
| 5,146,179 A | | 9/1992 | Carley et al. | |
| 5,287,071 A | | 2/1994 | Olmstead et al. | |
| 5,568,089 A | | 10/1996 | Maru | |
| 5,585,763 A | * | 12/1996 | Navabi et al. ............... | 330/255 |
| 5,606,283 A | * | 2/1997 | Allen et al. ............. | 330/124 R |
| 5,608,796 A | * | 3/1997 | Banu et al. .................. | 379/403 |
| 6,259,322 B1 | * | 7/2001 | Muza .......................... | 330/257 |

OTHER PUBLICATIONS

"Current Feedback Amplifier Analysis and Compensation", Texas Instruments Application Report, Mixed Signals Products, SLOA021A, Mar. 2001, 17 pages.

"Voltage Feedback Vs Current Feedback Op Amps", Texas Instruments Application Report, Mixed–Signal Products, SLVA051, Nov. 1998, 15 pages.

"The Current–Feedback Op Amp A High–Speed Building Block", Anthony D. Wang, Burr–Brown Application Bulletin, SBOA076, AB–193, No date available, 13 pages.

"Voltage–Feedback Amplifiers vs Current–Feedback Amplifiers: Bandwidth and Distortion Considerations", Tony Wang, Burr–Brown Application Bulletin, SBPA040, AS–091, Jan., 1994, 3 pages.

Current Feedback Amplifiers: Review, Stability Analysis, and Applications, John Austin, SBOA081, Burr–Brown Application Bulletin, Nov., 2000, 4 pages.

* cited by examiner

Primary Examiner—Brian Young
Assistant Examiner—John B Nguyen
(74) Attorney, Agent, or Firm—W. Daniel Swayze, Jr.; W. James Brady; Frederick J. Telecky, Jr.

(57) ABSTRACT

A current feedback amplifier is disclosed for providing a differential output based on a single-ended or differential input signal, having first and second low impedance inputs to receive first and second input signals, and first and second phase shifting systems providing first and second phase shifted input signals based on the second and first input signals. A first intermediate system provides a first intermediate signal comprising the first input signal and the first phase shifted input signal, and a second intermediate system provides a second intermediate signal comprising the second input signal and the second phase shifted input signal, wherein gains may be applied to one or more of the input and/or phase shifted signals. The amplifier further comprises first and second output buffers providing first and second differential output signals based on the first and second intermediate signals, respectively.

18 Claims, 6 Drawing Sheets

FULLY DIFFERENTIAL CURRENT FEEDBACK AMPLIFIER

FIELD OF INVENTION

The present invention relates generally to the art of amplifier circuits and more particularly to a fully differential current feedback amplifier.

BACKGROUND OF THE INVENTION

In broadband and wireless communications systems, information is transferred between sources and destinations through various communications media. For example, in wireless systems, analog signals carrying information are transmitted to and received from the ambient via an antenna. When such a communications signal is received, it is initially processed in an analog signal chain between the receiving antenna and a digital processing system. An analog to digital (A/D) converter digitizes the processed analog signal, which is then subjected to signal processing to obtain the received signal information. The analog signal chain operates to condition, filter, and amplify the received analog signal, and to provide frequency conversion as necessary in order to reduce noise and to provide a proper input signal to the A/D converter. Recently, the frequencies of signals within such circuits are increasing in order to provide improved speed, conforming to communication protocols or standards, etc. Consequently, analog signal chains and particularly amplifiers thereof in modern communications systems are required to operate at ever higher frequencies with larger dynamic range, decreased distortion, and lower power supply voltages.

In a typical communications system, an antenna signal is provided to a low noise amplifier (LNA), and from there into a mixer that takes the received signal from the transmission frequency down to an intermediate frequency. More than one such frequency down-conversion may take place, for example, via subsequent mixer stages. Various filters, such as band-pass filter stages, are typically provided between the antenna, amplifiers, and mixers, in order to reduce or remove noise and signals that are outside the frequency band of interest. Once the resulting analog signal has been converted to a manageable frequency, it is amplified once again and provided to an A/D converter. In order to perform a proper A/D conversion so as to extract all the information of interest from the signal, it is desirable to provide the A/D with a very large signal. Thus, one or more amplifiers are found in the typical analog signal chain to amplify the relatively weak signal at the antenna and/or at intermediate stages, wherein the A/D converter receives a signal which is slow enough to digitize, and also amplified so that the A/D can digitize all the fine signal details.

Initially, a relatively weak single-ended signal is obtained from the receiving antenna. Differential signals have many advantages over single-ended signals in such systems, including increased dynamic range for a given supply voltage, suppression of even order harmonic distortion, and enhanced common mode noise rejection. Thus, at some point in the analog signal chain, the single-ended signal is converted into a differential signal. The earlier that the conversion from single-ended to differential takes place in the signal chain, the earlier the benefits of differential signals are realized in the communications system. A portion of a conventional heterodyne type receiver system 10 is illustrated in prior art FIG. 1, where a heterodyne receiver translates the desired radio frequency (RF) signal to one or more intermediate frequencies before demodulation. The exemplary receiver system 10 includes several active and passive function blocks and each contributes to the system's overall signal gain and noise figure (NF). The receiver system 10 of FIG. 1 includes an antenna 12, a duplexer 14, an amplifier 16, one or more filters 18a and 18b, a mixer 20 driven by a local oscillator (LO) 21, a second amplifier 24, and an A/D converter 26.

The antenna 12 provides an interface between free space and the receiver input. The duplexer 14 interfaces with the antenna 12 and allows simultaneous transmitter and receiver operations with a single antenna, wherein the duplexer 14 operates to isolate the receiver system 10 and a transmitter 22 from each other while providing a generally low loss connection to the antenna 12 for both systems. The system 10 also includes a first amplifier 16, typically a low-noise amplifier (LNA), which increases the amplitude of the signal received from the antenna 12 allowing further processing by the receiver 10. An ideal amplifier increases the amplitude of the received signal without adding distortion or noise. Real world amplifiers, however, add noise and distortion to the received signal, and attempts are made to minimize signal degradations. The LNA 16 is the first amplifier after the antenna 12 in the system 10 and contributes most significantly to the system noise figure, consequently the amplifier 16 is typically designed to minimize noise, and hence the name LNA.

Band-pass type filters 18a and 18b form one or more networks which allow a range of RF frequencies to pass therethrough, while blocking RF signals outside of their designed passband. The filter 18a located before the LNA 16 is called a preselect filter and the post-amplifier filter 18b is often called an image-reject filter. The preselect filter 18a prevents signals far outside of the desired passband from saturating the front end of the amplifier 16 so as to reduce intermodulation distortion products related to those signals at far away frequencies, while the image-reject filter 18b rejects spurious response type signals. The mixer 20 translates the received, filtered, and amplified RF signal to both a higher and lower intermediate frequency (IF) value. One of the intermediate frequencies is passed while the other is rejected (e.g., called either up-conversion or down-conversion, respectively), using translation with a signal from the local oscillator 21, which mixes with the RF signal. Thereafter, a second amplifier 24 further amplifies the analog signal from the mixer 20 and provides an input to the A/D converter 26.

Many conventional mixers are designed to receive a differential input because differential signals help in decoupling the system 10 from noise in the integrated circuit substrate, thereby lowering the system NF, and aid in facilitating high device integration. Where the mixer 20 is designed to receive a differential signal input and the antenna 12 generates a single-ended received signal, the system 10 must transform the single-ended signal into a differential signal somewhere between the antenna 12 and the mixer 20. Conventional solutions which perform a transformation from a single-ended signal to differential signals before the LNA 16 have been found undesirable because prior to amplification the received signal is weak and the transformation results in too much loss, thereby degrading the integrity of the received signal. Similarly, conventional post-LNA transformation solutions have been found to be undesirable because of linearity issues. Alternatively, the single-ended to differential conversion can be performed in either the first LNA 16 or in the second amplifier 24 supplying a differential input to the A/D converter 26.

Conversions or translations of single-ended signals to differential signals have sometimes been accomplished using differential voltage feedback amplifiers or current feedback amplifiers, each having particular shortcomings. In the first case, the amplifiers 16 and/or 26 in FIG. 1 may be such a voltage feedback type amplifier. However, voltage feedback amplifiers suffer from various drawbacks in high-speed applications. For instance, the bandwidth in differential voltage feedback amplifiers is dependent upon gain, thus limiting design flexibility for gain adjustment where a large bandwidth is contemplated. For example, with a voltage feedback amplifier, as the amplifier closed loop gain is increased, the speed of the signals it is able to support decreases. Thus, conventional voltage feedback amplifiers are typically slower (e.g., with respect to the bandwidth that they're capable of achieving, and the slew rates that they're capable of supporting) than are current feedback type amplifiers.

Alternatively, as illustrated in FIG. 2, two current feedback type amplifiers 30 and 32 have sometimes been employed with appropriate feedback resistors 34–37 to provide a differential output $V_{OUT}$ based on a single-ended input $V_{IN}$. Current feedback amps are usually able to handle signals that are coming in faster and swinging higher, compared with the voltage feedback amplifiers. The current feedback amplifiers 30 and 32 do not suffer from the gain-bandwidth dependencies experienced with voltage feedback amplifiers. However, this current feedback amplifier approach requires a transformer 38 to couple the single-ended signal $V_{IN}$ to the individual current feedback amplifiers 30 and 32, resulting in increased cost, physical space, and other problems associated with transformer 38. For instance, the transformer 38 itself may degrade system performance with respect to noise and/or signal loss, and may have inherent bandwidth limitations.

Thus, designers of modern communications system analog signal chains have heretofore been forced into a design tradeoff between the relative strengths and weaknesses of either voltage feedback amplifiers or current feedback amplifiers. As a result, there is a need for improved amplifiers for differential or single-ended inputs, which reduces or mitigates some or all the above-mentioned difficulties previously experienced with voltage feedback amplifiers or current feedback amplifiers in high-speed communications system applications such as digital subscriber line (DSL) and wireless communications systems, such as mobile battery operated systems and high performance base stations.

SUMMARY OF THE INVENTION

The following presents a simplified summary in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later.

The present invention involves differential current feedback amplifiers, which provide two low impedance inputs, and two differential outputs which are about 180 electrical degrees out of phase with respect to one another, wherein feedback loops use currents rather than voltages as feedback error signals. This is in contrast to voltage feedback amplifiers having two high impedance inputs, and conventional current feedback amplifiers having one high impedance input (e.g., typically the non-inverting input) and one low impedance input (e.g., the inverting input). Thus, the invention contemplates fully differential current feedback amplifiers, which provide a differential output based on differential input signals or a single-ended input, without the need for an external transformer. The differential current feedback amplifier further provides speed and gain-bandwidth independence advantages associated with prior current feedback amplifiers. Thus, the invention finds application in high-speed communications and other systems, allowing system designers significantly improved design flexibility in selecting gains and bandwidths without sacrificing performance. In addition to communications systems, the differential current feedback amplifiers of the invention find application in other systems as well.

In one aspect of the invention, a differential current feedback amplifier is provided having low impedance inputs to receive first and second input signals, and first and second phase shifting systems or circuits providing first and second phase shifted input signals based on the second and first input signals, respectively. In one implementation, the phase inversion aspects of the invention may involve current steering amplifier circuitry having a constant current source and two identical collector connected transistors. The first input signal and the first phase shifted signal are combined or summed in order to provide a first intermediate signal and the second input signal and the second phase shifted signal are summed to provide a second intermediate signal. Each intermediate signal thus represents the combination (e.g., summation) of one input and a phase shifted version of the other input.

The intermediate signals are then buffered to provide differential outputs. The first differential output thus represents the first input signal and a phase shifted version of the second input signal. Likewise, the second differential output signal represents the second input signal and a phase shifted version of the first input signal. The differential current feedback amplifier may thus be connected so as to amplify a differential input signal, or to convert a single-ended input signal into an amplified differential output signal. In either configuration, the gain is largely independent of bandwidth, thus providing advantages in high-speed system design.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
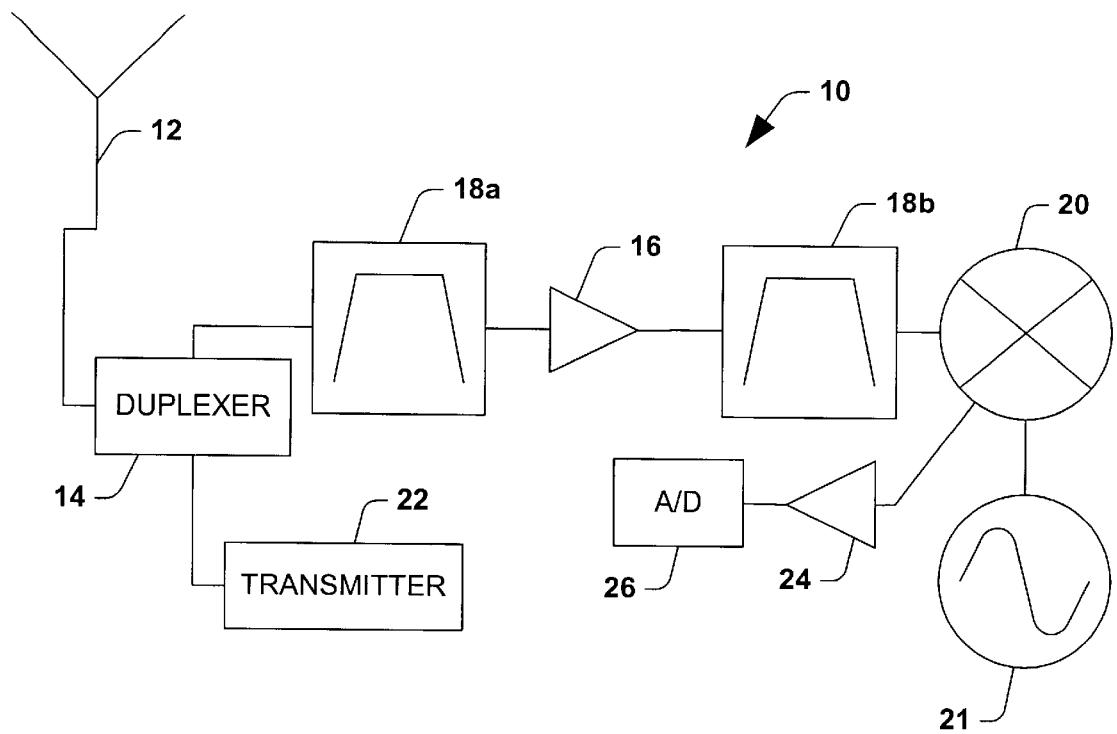
FIG. 1 is a schematic diagram illustrating a portion of a conventional heterodyne type receiver system.
Figure 2:
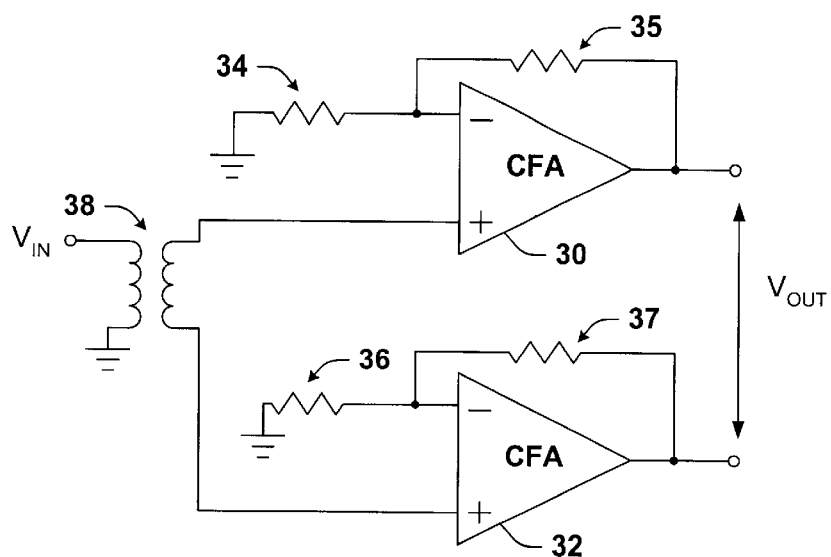
FIG. 2 is a schematic diagram illustrating a single-ended to differential conversion using two conventional current feedback amplifiers and a transformer.

The present invention will now be described with reference to the attached drawings, wherein like reference numerals are used to refer to like elements throughout. The invention relates to differential current feedback amplifiers with which single-ended to differential conversion can be achieved without an external transformer and which provides performance enhancement over voltage feedback amplifier configurations, particularly in high-speed analog signal chains for communications systems. The differential current feedback amplifiers of the invention can alternatively be employed in differential-to-differential amplifier configurations. Thus, the invention provides flexible solutions to high-speed and other analog amplification applications without the design tradeoffs inherent in using conventional voltage feedback or current feedback amplifiers.

Figure 3:
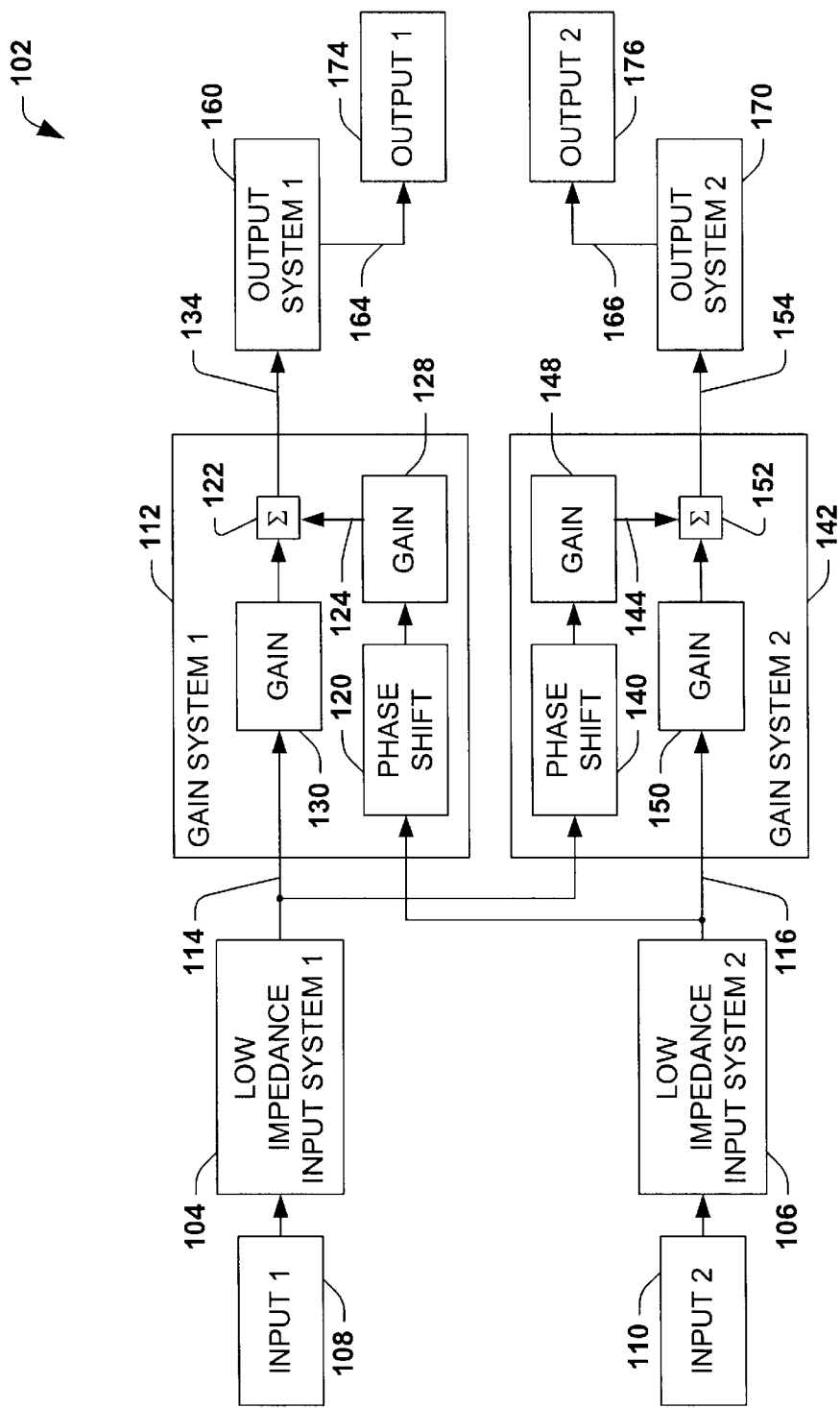
FIG. 3 is a schematic diagram illustrating an exemplary differential current feedback amplifier in accordance with the present invention.

Referring now to the drawings, wherein the illustrations and the following description are provided to illustrate one or more aspects of the invention and not to limit the same, FIG. 3 illustrates one implementation of one or more features of the invention in which a differential current feedback amplifier 102 comprises first and second low impedance input systems 104 and 106 operatively coupled with first and second input terminals 108 and 110, respectively. A first intermediate gain system 112 receives first and second input signals 114 and 116 from the low impedance input systems 104 and 106, respectively. Because the input systems 104 are low impedance, the signals 114 and 116 can be current feedback signals in a single-ended to differential or differential-to-differential amplifier configuration.

The first input signal 114 is provided to a summer circuit 122 via a first gain circuit 130. A phase shift system 120 and a second gain circuit 128 provide a first phase shifted signal 124 based on the second input signal 116 to the summer circuit 122. In accordance with an aspect of the invention, the first phase shifted signal 124 is out of phase with the second input signal 116 from which it was derived by a first phase shift value, such as about 180 electrical degrees. The first intermediate gain system 112 provides a first intermediate signal 134 based on the first input signal 114 and the first phase shifted signal 124 via the summer 122.

A second gain system 142 receives the first and second input signals 114 and 116, and provides the second input signal 116 to a summer circuit 152 via a third gain circuit 150. The first input signal 114 is phase shifted in a second phase shift system 140, which provides a second phase shifted input signal 144 to the summer 152 via a fourth gain circuit 148. The gain circuits 128, 130, 148, and 150 may each apply individual gains to the respectively associated signals, which gains may be any value including unity. As with the first phase shift system 120, the second phase shift system 140 provides the second phase shifted signal 144 out of phase with the first input signal 114 by a second phase shift value, such as about 180 electrical degrees. The summer 152 of the second gain system 142 provides a second intermediate signal 154 based on the second input signal 116 and the second phase shifted signal 144.

The amplifier 102 further comprises first and second output systems 160 and 170 receiving the first and second intermediate signals 134 and 154, respectively, which provide first and second differential output signals 164 and 166 to first and second output components such as terminals 174 and 176 based on the first and second intermediate signals 134 and 154, respectively. Because of the phase shifting of the input signals 114 and 116 via the phase shift systems 140 and 120, respectively, and the combination of the phase shifted signals 124 and 144 with the complimentary (e.g., non-shifted) input signals 114 and 116 in the summers 122 and 152, respectively, the output signals 164 and 166 are about 180 degrees out of phase with one another, whereby fully differential outputs are provided by the amplifier 102.

It is also noted at this point that where a single-ended input is applied to the amplifier 102 (e.g., as illustrated and described hereinafter with respect to FIG. 7a), the amplifier 102 also provides fully differential output signals 164 and 166 at the output terminals 174 and 176, respectively. For example, in the exemplary amplifier 102 of FIG. 3, where no signal is connected to the second input terminal 110, the first input signal 114 is passed through the first gain system 112 to the first output terminal 174 without phase shifting. At the same time, the first input signals 114 is phase shifted via the phase shifting system 140 in the second gain system 142, and provided through the summer 152 and output buffer system 170 to the second output terminal 176. In this single-ended input example, then, the output signals 164 and 166 at terminals 174 and 176 are 180 degrees out of phase with one another in accordance with the invention. Thus, the invention provides differential current feedback amplifiers, which may be connected so as to amplify a differential input signal, or to convert a single-ended input signal into an amplified differential output signal. In either configuration, the gain is largely independent of bandwidth due to the low impedance inputs, thus providing advantages in high-speed system design As with other implementations of the present invention illustrated and described herein, the differential current feedback amplifier 102 illustrated in FIG. 3 may be implemented in various forms, including dedicated integrated circuits (e.g., 8 or 16 pin dual in-line DIP or SO packages) or as part of composite integrated circuits comprising one or more such differential current feedback amplifiers and/or other components or circuits, such as application specific integrated circuits (ASICs). In such implementations, the low impedance input systems (e.g., systems 104 and 106 of FIG. 3) and/or the intermediate high impedance gain systems (systems 112 and 142) may individually comprise sourcing and sinking sub-systems. For instance, the first and second input circuits may individually comprise low impedance sourcing circuitry operative to source current to the associated input terminal as well as low impedance sinking circuitry adapted to sink current from the input terminal. Additionally, the intermediate high impedance gain stages may likewise be segmented into sourcing and sinking circuitry.

Figure 4:
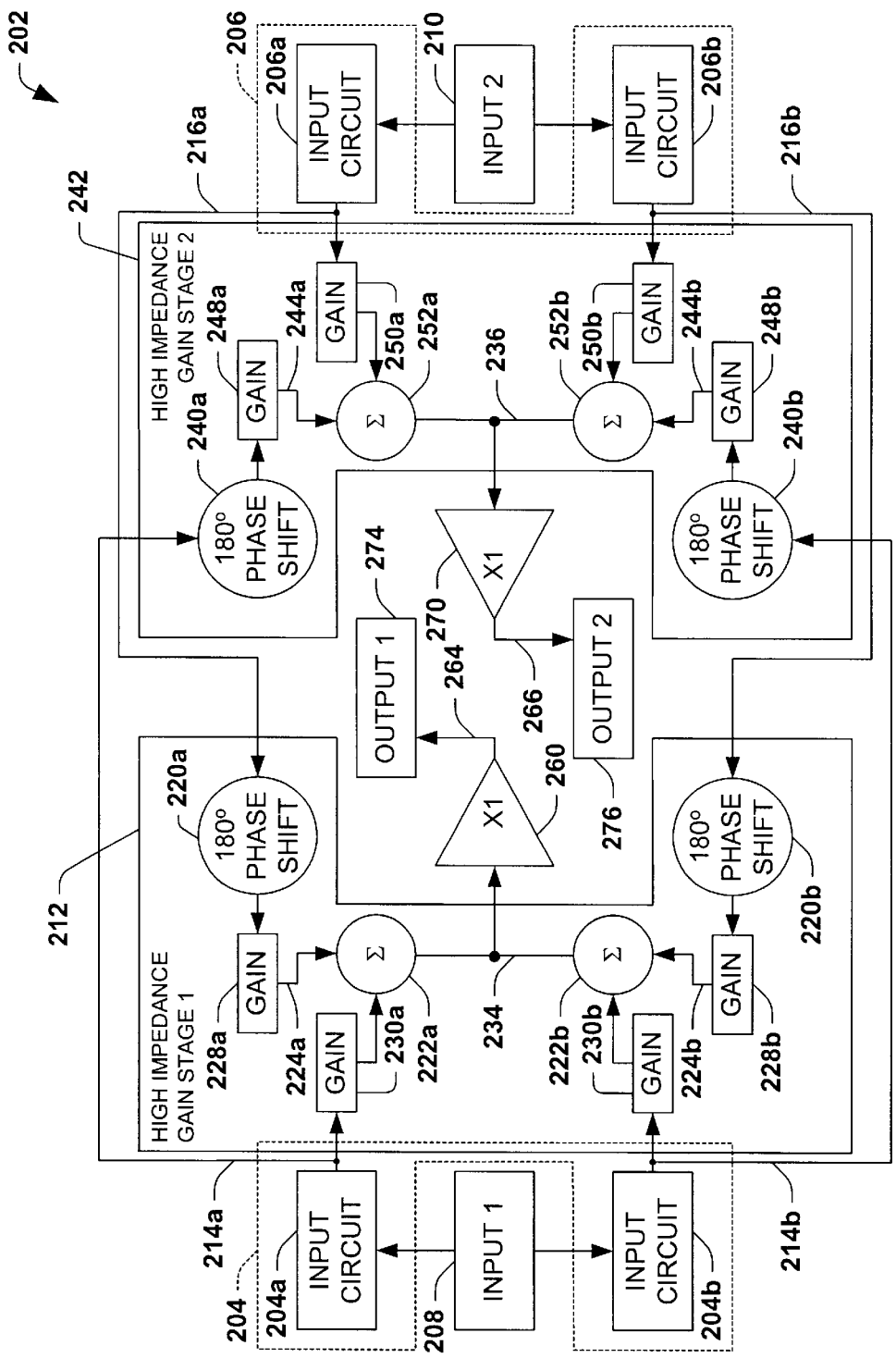
FIG. 4 is a schematic diagram illustrating another exemplary differential current feedback amplifier in accordance with the invention.

An example of such a bifurcated implementation of the present invention is illustrated in FIG. 4, wherein an exemplary differential current feedback amplifier 202 comprises first and second input terminals 208 and 210 coupled with first and second low impedance input systems 204 and 206, respectively. A first high impedance gain stage or system 212 receives first and second input signals 214a and 216a from the first and second low impedance input systems 204 and 206, respectively, wherein the first and second sourcing input signals 214a and 216a are obtained from first and second sourcing input circuits 204a and 206a in the first and second low impedance input systems 204 and 206, respectively.

The first and second sourcing input circuits 204a and 206a are operable to source current to the input terminals 208 and 210, respectively, whereas complimentary first and second sinking input circuits 204b and 206b operate to sink current from the input terminals 208 and 210, respectively. Similarly, the first high impedance gain stage 212 receives first and second sinking input signals 214b and 216b from the first and second low impedance sinking input circuits 204b and 206b of the first and second low impedance input systems 204 and 206, respectively. The first gain system 212 phase shifts the second sourcing and sinking input signals 216a and 216b by about 180 electrical degrees and provides a first intermediate signal 234 based thereon, as will be discussed in greater detail below.

The first gain system 212 comprises a first sourcing gain circuit 230a, which applies a first sourcing gain to the first sourcing input signal 214a, and a first sinking gain circuit 230b applying a first sinking gain to the first sinking input signal 214b. The system 212 further provides a first sourcing phase shift system 220a operative to receive the second sourcing input signal 216a and to provide a first sourcing phase shifted signal 224a about 180 electrical degrees out of phase with the second sourcing input signal 216a via a second sourcing gain circuit 228a applying a second sourcing gain thereto. The system 212 further comprises a first sinking phase shift system 220b receiving the second sinking input signal 216b and to providing a first sinking phase shifted signal 224b about 180 electrical degrees out of phase with the second sinking input signal 216b via a second sinking gain circuit 228b. The first high impedance gain stage or system 212 thus provides the first intermediate signal 234 corresponding to the sum of the first sourcing input signal 214a, the first sourcing phase shifted signal 224a, the first sinking input signal 214b, and the first sinking phase shifted signal 224b using summers 222a and 222b.

The differential current feedback amplifier 202 further comprises a second high impedance gain stage or system 242 receiving the first and second input signals 214a, 214b, and 216a, 216b, respectively. The system 242 operates to provide second phase shifted signals 244a and 244b based on the first input signals 214a and 214b, respectively, as well as a second intermediate signal 236 based on the second input signals 216a, 216b and the second phase shifted signals 244a, 244b. The second gain system 242 comprises a third sourcing gain circuit 250a applying a third sourcing gain to the second sourcing input signal 216a, and a third sinking gain circuit 250b applying a third sinking gain to the second sinking input signal 216b. A second sourcing phase shift system 240a receives the first sourcing input signal 214a and provides a second sourcing phase shifted signal 244a about 180 electrical degrees out of phase with the first sourcing input signal 214a via a fourth sourcing gain circuit 248a. In addition, a second sinking phase shift system 240b provides a second sinking phase shifted signal 244b about 180 electrical degrees out of phase with the first sinking input signal 214b via a fourth sinking gain circuit 248b applying a fourth sinking gain to the second sinking phase shifted signal 244b.

The second high impedance gain stage 242 thus provides a second intermediate signal 236 corresponding to the sum of the second sourcing input signal 216a, the second sourcing phase shifted signal 244a, the second sinking input signal 216b, and the second sinking phase shifted signal 244b using summers 252a and 252b. The differential current feedback amplifier 202 further comprises first and second output systems or buffers 260 and 270 operatively coupled with the first and second high impedance gain systems 212 and 242 to receive the first and second intermediate signals 234 and 236, respectively. The output buffer systems 260 and 270 provide first and second differential output signals 264 and 266 to first and second output components such as terminals 274 and 276 based on the first and second intermediate signals 234 and 236, respectively.

Figure 5:
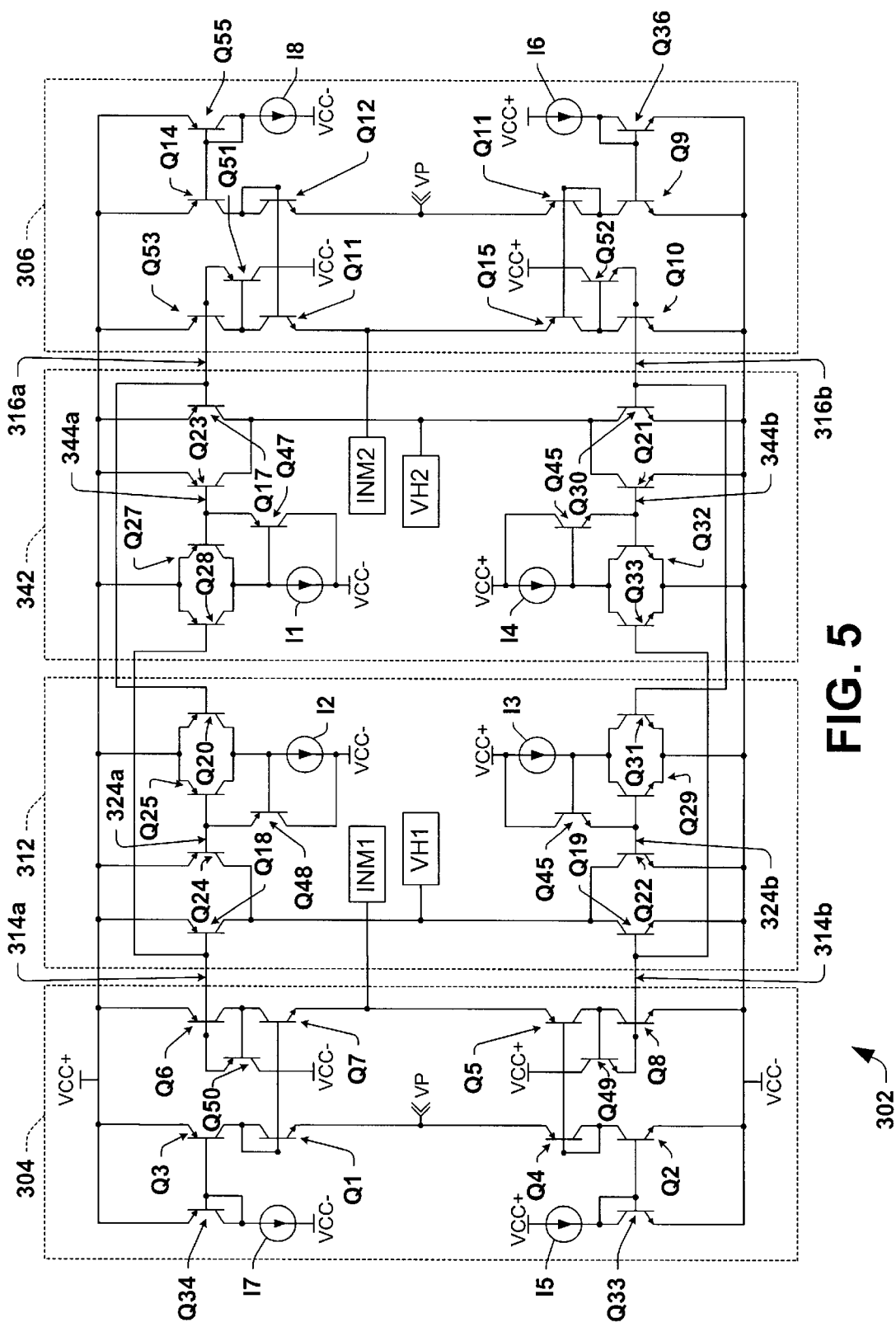
FIG. 5 is a detailed schematic diagram illustrating a portion of another exemplary differential current feedback amplifier in accordance with the invention.
Figure 6:
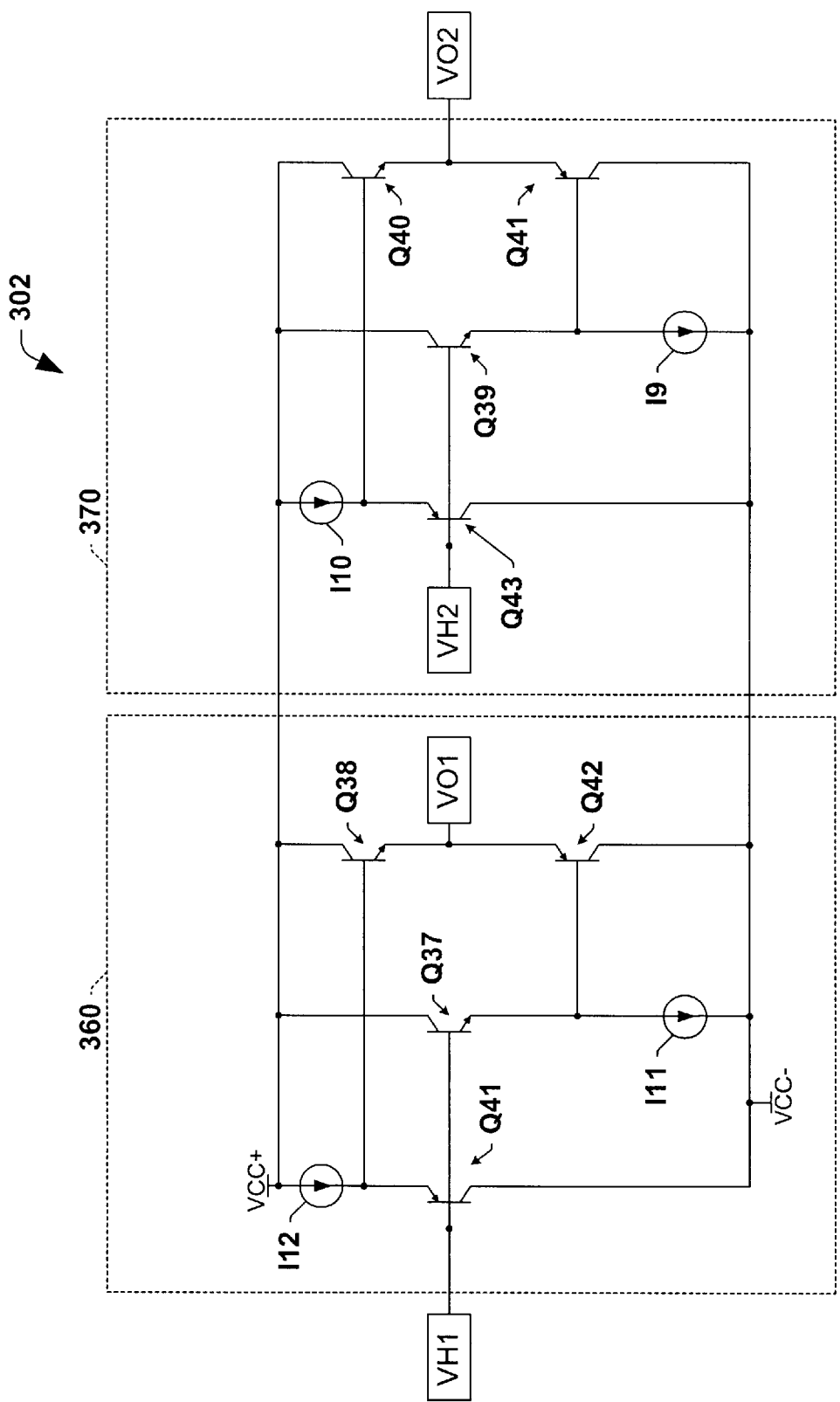
FIG. 6 is a schematic diagram illustrating further details of the differential current feedback amplifier of FIG. 5.

The differential current feedback amplifiers of the invention may be implemented in a variety of architectures in discrete integrated circuit form. FIGS. 5 and 6 illustrate in detail one such transistor-based implementation (e.g., a bipolar implementation), wherein various aspects of the present invention are carried out. Referring initially to FIG. 5, a differential current feedback amplifier 302 is illustrated for providing a differential output based on a single-ended or differential input, comprising first and second low impedance input systems 304 and 306 operatively coupled with first and second input terminals INM1 and INM2, respectively. A first intermediate gain system 312 receives first and second input signals 314a, 314b and 316a, 316b from the first and second input systems 304 and 306, respectively. The system 312 provides first phase shifted signals 324a and 324b based on the second input signals 316a and 316b, respectively, and provides a first intermediate signal at node VH1 based on the first input signals 314a, 314b and the first phase shifted signals 324a, 324b, wherein the first phase shifted signals 314a, 314b are out of phase with the second input signals 316a, 316b, respectively, by a first phase shift value, such as about 180 electrical degrees.

Similarly, a second intermediate gain system 342 receives first and second input signals 314a, 314b and 316a, 316b from the first and second input systems 304 and 306, respectively. The system 342 provides second phase shifted signals 344a and 344b based on the first input signals 314a and 314b, respectively, as described in greater detail below. The system 342 also provides a second intermediate signal at node VH2 based on the second input signals 316a, 316b and the second phase shifted signals 344a, 344b, wherein the second phase shifted signals 344a, 344b are out of phase with the first input signals 314a, 314b, respectively, by a second phase shift value, such as about 180 electrical degrees. Referring also to FIG. 6, the first and second intermediate signals at nodes VH1 and VH2 are then buffered using first and second output systems 360 and 370 in order to provide first and second differential output signals at output terminals V01 and V02, respectively.

A first input signal at terminal INM1 of FIG. 5 will be provided or sourced current from transistors Q6 and Q7, which are biased by transistors Q3 and Q34 and a current source 17. If the signal at INM1 provides current to the amplifier 304, such current is sinked to transistors Q5 and Q8 in complimentary fashion. Where the amplifier 302 sources input current to terminal INM1, the resulting current through Q6 is representative of the first input signal at INM1, which is then mirrored to transistors Q18 and Q28. Transistor Q50 in the first input system 304 is provided so as to supply any current required by the bases of the mirror transistors Q18 and Q28, in order to reduce or minimize mirroring error. The size ratio between transistors Q6 and Q18 is such that a gain of approximately 2.4 is provided in the exemplary amplifier 302, although any appropriate gain can be achieved by adjustment of the relative sizes thereof.

In this regard, the sizes of transistors Q6 and Q28 are approximately equal, thereby providing essentially no gain in the mirroring of the current through Q6 to the transistor Q28.

The current through Q24 of the first intermediate system 312 thus reflects reflect the current through Q6 by virtue of the current mirror configuration wherein the bases of Q6 and Q18 (e.g., as well as the base of Q28) are tied together. The collector of Q18 is tied to a summing node VH1 for combination with a phase shifted version of the second input signal thereat, as will be discussed in greater detail in accordance with the invention. As illustrated in FIG. 5, the complimentary circuitry at the bottom (e.g., sinking) portions of the first input circuit 304 and the first intermediate gain system 312 operate to mirror input current through transistor Q8 to transistors Q19 and Q29, wherein the current through Q19 is representative of the input signal at INM1, and is provided to the summing node VH1 via connection thereto of the collector of transistor Q19. In the exemplary amplifier 302, the sizes of transistors Q6, Q18 and Q28 are similar to those of transistors Q8, Q19 and Q29, respectively.

In the second low impedance input system 306, second input signals at input terminal INM2 cause sourcing current to flow through transistors Q11 and Q53, wherein the current through Q53 is mirrored to a transistor Q17 in the second intermediate system 342 as well as to a transistor Q20 in the first intermediate system 312. The transistor Q20, in turn, is configured with a second transistor Q25 with the emitters thereof connected to a power supply rail VCC+, and the collectors thereof tied to a current source 12 to act as a current steering amplifier. This configuration of Q20, Q25 and source 12 operate to effectuate a phase shifting of the second input signal 316a, whereby the signal 324a at the base of transistor Q25 is mirrored to a transistor Q24 via connection of the bases of Q24 and Q25 together at 324a. In this regard, the current through the second transistor Q25 is equal to the fixed current through the source 12 minus the current (e.g., representative of the second input signal 316a) through transistor Q20. The relative sizes of transistors Q24 and Q25 provide a gain of about 2.4 for mirroring the phase shifted signal 324a.

Thus, the first phase shifted signal 324a is representative of a 180 degree phase shifting of the second input signal 316a. The summing node VH1 combines or sums the currents from Q24 and Q18, together with the complimentary currents from transistors Q19 and Q22, in order to provide the first intermediate signal at VH1. In the lower portion of FIG. 5, a complimentary phase shifting circuit is formed by transistors Q31 and Q29, together with a current source 13. The second input signal 316b is mirrored from Q10 and is shifted to provide phase shifted signal 324b, which is combined with the first input signal 314b via connection of the collectors of transistors Q19 and Q22 to the summing junction or node VH1.

Similar phase shifting circuits or systems are provided in the second intermediate gain system 342 for providing phase shifted versions of the first input signals 314a and 314b for combination with the second input signals 316a and 316b. Transistors Q28 and Q27 and current source 11 provide a second sourcing phase shifted signal 344a by phase shifting the first input signal 314a (e.g., mirrored to transistor Q28 from transistor Q6). The shifted signal 344a is then combined with the second (e.g., sourcing) input signal 316a by connection of the collectors of transistors Q23 and Q17 together at a summing node VH2. Similarly, transistors Q32 and Q33 and a current source 14 phase shift the first sinking input signal 314b to provide the second sinking phase shifted signal 344b, which is combined at node VH2 with the second sinking input signal 316b via transistors Q30 and Q21.

As illustrated in FIG. 6, the first and second output systems 360 and 370 buffer the intermediate signals at VH1 and VH2 from the high impedance intermediate gain systems 312 and 342, respectively, in order to provide enough drive capability to interface with subsequent circuitry. For instance, in reference to FIG. 1, where the exemplary current feedback amplifier 302 is employed as the second amplifier 24 for driving an A/D converter 26, the output systems 360 and 370 provide enough current drive to support the input impedances of a differential input (not shown) to the A/D converter 26, as well as to supply the feedback current for appropriate feedback networks (not shown).

Figure 7A:
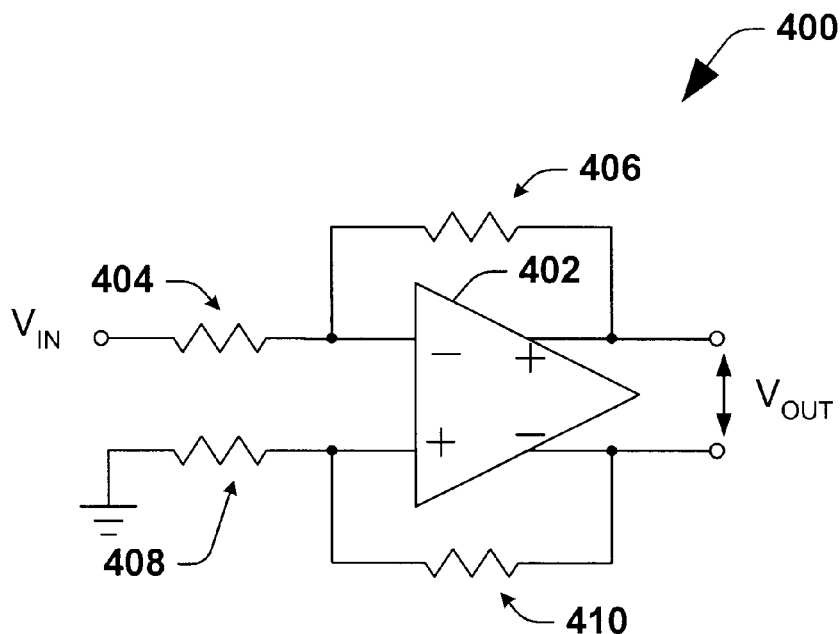
FIG. 7a is a schematic diagram illustrating an exemplary differential current feedback amplifier according to the invention configured to convert a single-ended input signal to a differential output.
Figure 7B:
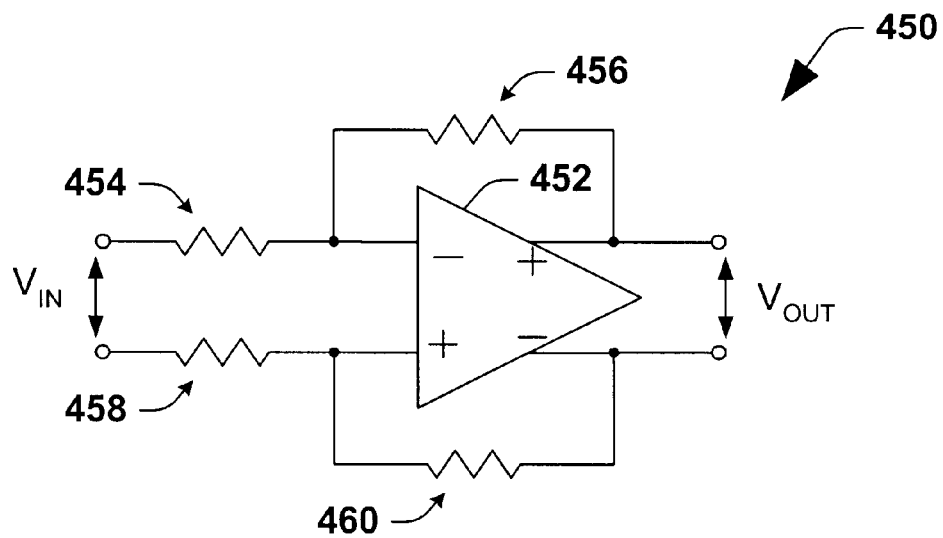
FIG. 7b is a schematic diagram illustrating an exemplary differential current feedback amplifier according to the invention configured to amplify a differential input signal to produce a differential output.

Referring now to FIGS. 7a and 7b, differential current feedback amplifiers according to the invention may be employed in a variety of signal amplification applications, two of which 400 and 450, are illustrated in FIGS. 7a and 7b, respectively. In FIG. 7a, a differential current feedback amplifier 402 in accordance with the present invention is employed to provide amplification of a single-ended input $V_{IN}$ to provide a differential output $V_{OUT}$ using appropriate feedback resistors 404, 406, 408, and 410. The closed-loop gain of the configuration 400 can be set according to the relative sizes of the resistors 404, 406, 408, and 410 in accordance with known feedback principles. It is noted that the inverting and non-inverting inputs to the amplifier 402 correspond with the input terminals of the various current feedback amplifiers 102, 202, and/or 302 illustrated and described above. For example, the input terminals INM1 and INM2 of the amplifier 302 (FIG. 5) can be connected as illustrated in FIG. 7a, wherein the differential output terminals correspond with output terminals VO1 and VO2 (FIG. 6). Alternatively, the differential current feedback amplifiers may be employed in a differential-to-differential amplification configuration 450, as illustrated in FIG. 7b, using feedback resistors 454, 456, 458, and 460, wherein a differential input $V_{IN}$ is amplified to provide a differential output $V_{OUT}$ with a gain determined by the resistors 454, 456, 458, and 460.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description and the claims, such terms are intended to be inclusive in a manner similar to the term "comprising."

What is claimed is:

1. A differential current feedback amplifier for providing a differential output based on at least one input, comprising:

first and second low impedance input systems operatively coupled with first and second input terminals, respectively;

a first gain system receiving first and second input signals from the first and second low impedance input systems, respectively, and operative to provide a first phase shifted signal based on the second input signal and a first intermediate signal based on the first input signal and the first phase shifted signal, wherein the first phase shifted signal is out of phase with the second input signal by a first phase shift value;

a second gain system receiving the first and second input signals, and operative to provide a second phase shifted signal based on the first input signal and a second intermediate signal based on the second input signal and the second phase shifted signal, wherein the second phase shifted signal is out of phase with the first input signal by a second phase shift value; and first and second output systems operatively coupled with the first and second gain systems to receive the first and second intermediate signals, respectively, and to provide first and second differential output signals to first and second output terminals based on the first and second intermediate signals, respectively.

2. The amplifier of claim 1, wherein the first and second phase shift values are about 180 electrical degrees.

3. The amplifier of claim 1, wherein the first gain system comprises a first phase shift system operative to receive the second input signal and to provide the first phase shifted signal about 180 electrical degrees out of phase with the second input signal, and wherein the second gain system comprises a second phase shift system operative to receive the first input signal and to provide the second phase shifted signal about 180 electrical degrees out of phase with the first input signal.

4. The amplifier of claim 3, wherein at least one of the first and second phase shift systems comprises first and second transistors having first and second emitters connected to a supply rail and first and second collectors, respectively, connected to a current source supplying a generally fixed current equal to the sum of currents through the first and second transistors, with a first base of the first transistor receiving a signal to be phase shifted, wherein the current through the second transistor is generally equal to the fixed current minus the current through the first transistor, and wherein the phase shifted signal associated with the at least one of the first and second phase shift systems comprises the current through the second transistor, by which the phase shifted signal is about 180 electrical degrees out of phase with the signal to be phase shifted.

5. The amplifier of claim 1, wherein the first and second low impedance input systems individually comprise:

a low impedance sourcing input circuit operatively coupled with the corresponding input terminal to source input current thereto and to provide a corresponding sourcing input signal; and a low impedance sinking input circuit operatively coupled with the corresponding input terminal to sink input current therefrom and to provide a corresponding sinking input signal, wherein the first and second low impedance input systems provide the first and second input signals, respectively, and wherein the first and second input signals individually comprise the sourcing and sinking input signals from the corresponding one of the first and second low impedance input systems.

6. The amplifier of claim 5, wherein the first and second phase shift values are about 180 electrical degrees.

7. The amplifier of claim 5, wherein the first gain system comprises:

a first sourcing gain circuit applying a first sourcing gain to a first sourcing input signal;

a first sinking gain circuit applying a first sinking gain to a first sinking input signal;

a first sourcing phase shift system operative to receive a second sourcing input signal and to provide a first sourcing phase shifted signal about 180 electrical degrees out of phase with the second sourcing input signal;

a first sinking phase shift system operative to receive a second sinking input signal and to provide a first sinking phase shifted signal about 180 electrical degrees out of phase with the second sinking input signal;

a second sourcing gain circuit applying a second sourcing gain to the first sourcing phase shifted signal;

a second sinking gain circuit applying a second sinking gain to the first sinking phase shifted signal, and wherein the second gain system comprises:

a third sourcing gain circuit applying a third sourcing gain to the second sourcing input signal;

a third sinking gain circuit applying a third sinking gain to the second sinking input signal;

a second sourcing phase shift system operative to receive the first sourcing input signal and to provide a second sourcing phase shifted signal about 180 electrical degrees out of phase with the first sourcing input signal;

a second sinking phase shift system operative to receive the first sinking input signal and to provide a second sinking phase shifted signal about 180 electrical degrees out of phase with the first sinking input signal;

a fourth sourcing gain circuit applying a fourth sourcing gain to the second sourcing phase shifted signal; and a fourth sinking gain circuit applying a fourth sinking gain to the second sinking phase shifted signal.

8. The amplifier of claim 7, wherein the first intermediate signal comprises the sum of the first sourcing input signal, the first sourcing phase shifted signal, the first sinking input signal, and the first sinking phase shifted signal, and wherein the second intermediate signal comprises the sum of the second sourcing input signal, the second sourcing phase shifted signal, the second sinking input signal, and the second sinking phase shifted signal.

9. The amplifier of claim 7, wherein at least one of the first sourcing phase shift system, the first sinking phase shift system, the second sourcing phase shift system, and the second sinking phase shift system comprises first and second transistors having first and second emitters connected to a supply rail and first and second collectors, respectively, connected to a current source supplying a generally fixed current equal to a sum of currents through the first and second transistors, with a first base of the first transistor receiving a signal to be phase shifted, wherein the current through the second transistor is generally equal to the generally fixed current minus a current through the first transistor, and wherein the phase shifted signal associated with the at least one of the first and second phase shift systems comprises a current through the second transistor, by which the phase shifted signal is about 180 electrical degrees out of phase with the signal to be phase shifted.

10. The amplifier of claim 1, wherein the first gain system comprises a first gain circuit applying a first gain to the first input signal, a first phase shift system operative to receive the second input signal and to provide the first phase shifted signal about 180 electrical degrees out of phase with the second input signal, and a second gain circuit applying a second gain to the first phase shifted signal, and wherein the second gain system comprises a third gain circuit applying a third gain to the second input signal, a second phase shift system operative to receive the first input signal and to provide the second phase shifted signal about 180 electrical degrees out of phase with the first input signal, and a fourth gain circuit applying a fourth gain to the second phase shifted signal.

11. The amplifier of claim 10, wherein at least one of the first and second phase shift systems comprises first and second transistors having first and second emitters connected to a supply rail and first and second collectors, respectively, connected to a current source supplying a generally fixed current equal to a sum of currents through the first and second transistors, with a first base of the first transistor receiving a signal to be phase shifted, wherein a current through the second transistor is generally equal to the generally fixed current minus a current through the first transistor, and wherein the phase shifted signal associated with the at least one of the first and second phase shift systems comprises the current through the second transistor, by which the phase shifted signal is about 180 electrical degrees out of phase with the signal to be phase shifted.

12. A current feedback amplifier for providing a differential output based on at least one input, comprising:
 first and second low impedance input systems operatively coupled with first and second input terminals to receive first and second input signals therefrom, respectively;
 first and second phase shifting systems providing first and second phase shifted input signals based on the second and first input signals, respectively;
 first and second intermediate systems providing first and second intermediate signals, respectively, wherein the first intermediate signal comprises the first input signal and the first phase shifted input signal, and wherein the second intermediate signal comprises the second input signal and the second phase shifted input signal; and
 first and second output buffers receiving the first and second intermediate signals, respectively, and operative to provide first and second differential output signals to first and second output terminals based on the first and second intermediate signals, respectively.

13. The amplifier of claim 12, wherein the first phase shifted input signal is shifted about 180 electrical degrees with respect to the second input signal, and wherein the second phase shifted input signal is shifted about 180 electrical degrees with respect to the first input signal.

14. The amplifier of claim 12, wherein at least one of the first and second phase shifting systems comprises first and second transistors having first and second emitters connected to a supply rail and first and second collectors, respectively, connected to a current source supplying a generally fixed current equal to a sum of currents through the first and second transistors, with a first base of the first transistor receiving a signal to be phase shifted, wherein a current through the second transistor is generally equal to the generally fixed current minus a current through the first transistor, and wherein the phase shifted input signal associated with the at least one of the first and second phase shifting systems comprises the current through the second transistor, by which the phase shifted input signal is about 180 electrical degrees out of phase with the signal to be phase shifted.

15. The amplifier of claim 12, wherein the first intermediate system comprises a first gain circuit applying a first gain to the first input signal and a second gain circuit applying a second gain to the first phase shifted input signal, and wherein the second intermediate system comprises a third gain circuit applying a third gain to the second input signal and a fourth gain circuit applying a fourth gain to the second phase shifted input signal.

16. A current feedback amplifier for providing a differential output based on at least one input, comprising:
 first and second low impedance input systems operatively coupled with first and second input terminals to receive first and second input signals therefrom, respectively;
 means for providing first and second phase shifted input signals based on the second and first input signals, respectively;
 means for summing the first input signal and the first phase shifted input signal to provide a first intermediate signal at a first intermediate node;
 means for summing the second input signal and the second phase shifted input signal to provide a second intermediate signal at a second intermediate node; and
 means for providing first and second differential output signals to first and second output terminals based on the first and second intermediate signals, respectively.

17. The amplifier of claim 16, wherein the means for providing first and second phase shifted input signals comprises first and second phase shift systems, wherein at least one of the first and second phase shift systems comprises first and second transistors having first and second emitters connected to a supply rail and first and second collectors, respectively, connected to a current source supplying a generally fixed current equal to a sum of currents through the first and second transistors, with a first base of the first transistor receiving a signal to be phase shifted, wherein a current through the second transistor is generally equal to the generally fixed current minus a current through the first transistor, and wherein the phase shifted signal associated with the at least one of the first and second phase shift systems comprises the current through the second transistor, by which the phase shifted input signal is about 180 electrical degrees out of phase with the signal to be phase shifted.

18. The amplifier of claim 16, wherein the means for summing the first input signal and the first phase shifted input signal comprises first and second transistors having first and second emitters connected to a supply rail and first and second collectors, respectively, connected to the first intermediate node, with a first base of the first transistor receiving the first input signal and a second base of the second transistor receiving the first phase shifted input signal, by which the first intermediate signal is provided at the first intermediate node as a sum of the first input signal and the first phase shifted input signal, and wherein the means for summing the second input signal and the second phase shifted input signal comprises third and fourth transistors having third and fourth emitters connected to a supply rail and third and fourth, respectively, connected to the second intermediate node, with a third base of the third transistor receiving the second input signal and a fourth base of the fourth transistor receiving the second phase shifted input signal, by which the second intermediate signal is provided at the second intermediate node as a sum of the second input signal and the second phase shifted input signal.

* * * * *